(12) United States Patent
Tyagi

(10) Patent No.: US 6,372,583 B1
(45) Date of Patent: Apr. 16, 2002

(54) PROCESS FOR MAKING SEMICONDUCTOR DEVICE WITH EPITAXIALLY GROWN SOURCE AND DRAIN

(75) Inventor: Sunit Tyagi, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/500,556

(22) Filed: Feb. 9, 2000

(51) Int. Cl.⁷ .............................................. H01L 21/336
(52) U.S. Cl. ....................... 438/300; 438/269; 438/303; 438/481; 438/589
(58) Field of Search .................................. 438/300, 222, 438/269, 286, 299, 301, 303, 305, 306, 291, 481, 524, 589, 594, 595

(56) References Cited

U.S. PATENT DOCUMENTS 5,943,575 A * 8/1999 Chung .......................... 438/300
6,214,680 B1 * 4/2001 Quek et al. .................. 438/300

* cited by examiner

Primary Examiner—Chandra Chaudhari
Assistant Examiner—Jack Chen
(74) Attorney, Agent, or Firm—Mark V. Seeley

(57) ABSTRACT

A method for making a semiconductor device. In that method, source and drain regions are epitaxially grown on a first part of a substrate. After a gate oxide is formed on a second part of the substrate, an etched polysilicon layer is formed on the gate oxide.

13 Claims, 3 Drawing Sheets

PROCESS FOR MAKING SEMICONDUCTOR DEVICE WITH EPITAXIALLY GROWN SOURCE AND DRAIN

FIELD OF THE INVENTION

The present invention relates to semiconductor devices and a method for making them.

BACKGROUND OF THE INVENTION

How an MOS transistor's source and drain junctions are oriented with respect to the gate electrode may significantly affect the performance of sub 0.1 micron MOS devices. The source and drain regions for MOS transistors are conventionally formed by implanting dopants into a silicon substrate, then applying heat to cause those dopants to diffuse vertically and laterally within the substrate. This process does not generate junctions with sharp edges, as implant straggle and the nature of the diffusion process make it difficult to precisely control their location. Another issue relates to solid solubility considerations that limit the doping concentrations that may be achieved using such an ion implant process.

Accordingly, there is a need for a method for making an MOS device that includes a source and drain with sharp junctions and a controlled doping profile. There is also a need for a method for making such a device in which doping concentrations may exceed the solid solubility limits for a given dopant and substrate. The method of the present invention provides such a process.

SUMMARY OF THE INVENTION

The present invention covers a method for making a semiconductor device. In that method, source and drain regions are epitaxially grown on a first part of a substrate. A gate oxide is then formed on a second part of the substrate. After the gate oxide is formed, an etched polysilicon layer is formed on the gate oxide.

DETAILED DESCRIPTION OF THE PRESENT INVENTION

An improved method for making a semiconductor device is described. The method employs an epitaxial growth process to form highly doped source and drain regions that have abrupt junctions and that are self-aligned with a polysilicon gate electrode. The method of the present invention is described below with reference to the illustrations provided by FIGS. 1a–1h.

Figure 1A:
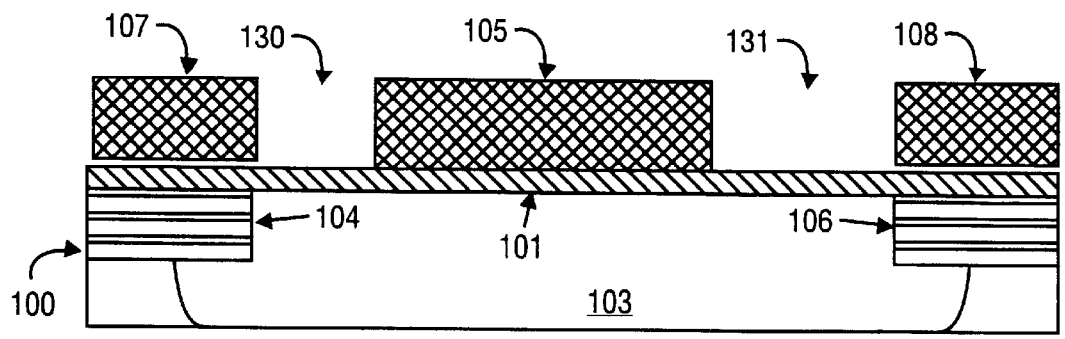
FIGS. 1a–1h are illustrations of cross-sections that reflect structures that may result after certain steps are used when carrying out the method of the present invention.
Figure 1B:
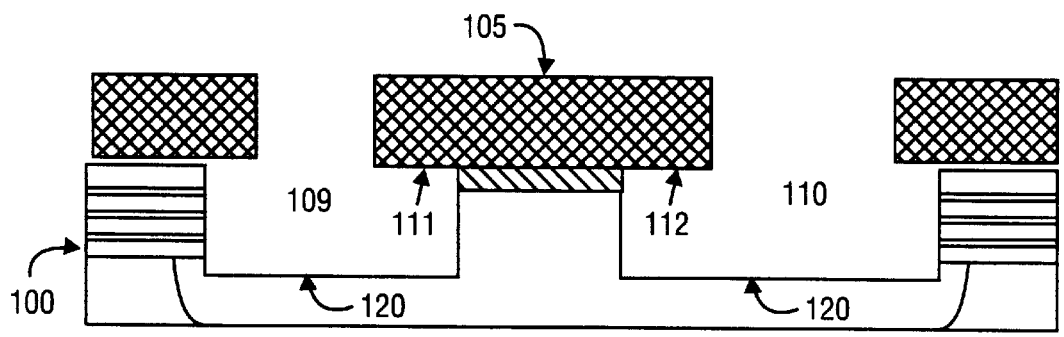

Initially, with reference to FIG. 1a, sacrificial oxide 101 is formed on substrate 100, which contains previously formed n-well (or p-well) 103 and isolation regions 104, 106. Oxide 101 preferably comprises silicon dioxide, which has been grown or deposited on substrate 100. Substrate 100 preferably comprises an epitaxial layer (doped p-) formed on a bulk silicon layer (doped p+). Oxide 101, well 103 and isolation regions 104, 106 may be formed using conventional materials and process steps.

After forming oxide 101, mask 105 is formed on top of it by applying conventional deposition and etching techniques. Mask 105 defines a region where an etched polysilicon layer and adjoining spacers will be formed. Mask 105 preferably is between about 40 and about 100 nanometers thick and preferably comprises silicon nitride. In a preferred embodiment of the present invention, masking structures 107, 108 are also formed—to protect isolation regions 104, 106. Structures 107, 108 may be formed when mask 105 is formed, e.g., by depositing a layer of silicon nitride over substrate 100, then applying a conventional anisotropic etch to remove selected portions of that layer. Oxide 101 acts as an etch stop for such a process step. Spaces 130, 131 that separate mask 105 from mask structures 107, 108 should be sufficiently wide to accommodate the source and drain contacts. In a preferred embodiment, spaces 130, 131 are between about 100 and about 200 nanometers wide.

After forming mask 105, unmasked portions of oxide 101 and the underlying portions of substrate 100 are removed to form trenches 109, 110, which are formed adjacent to mask 105. A two step etching process may be used to produce them. First, a dry anisotropic etch (using conventional equipment, materials and process conditions) may be used to remove the unmasked oxide and preferably between about 10 and about 20 nanometers of the underlying substrate. Next, a controllable isotropic etch (e.g., a wet etch for silicon that uses conventional equipment, materials and process conditions) may be applied to expand the etched regions. The resulting trenches 109, 110, shown in FIG. 1b, preferably extend into substrate 100 by between about 40 and about 60 nanometers, and generate first part 120 of substrate 100 upon which source and drain regions will be epitaxially grown. As shown in the figure, trenches 109, 110 include undercut regions 111, 112, which preferably extend beneath mask 105 by between about 20 and about 50 nanometers.

Figure 1C:
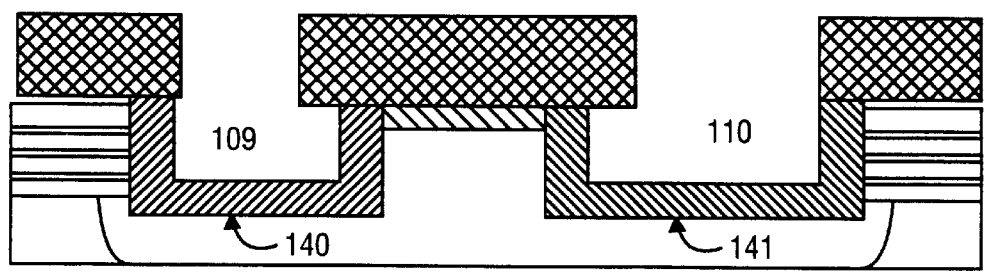
Figure 1D:
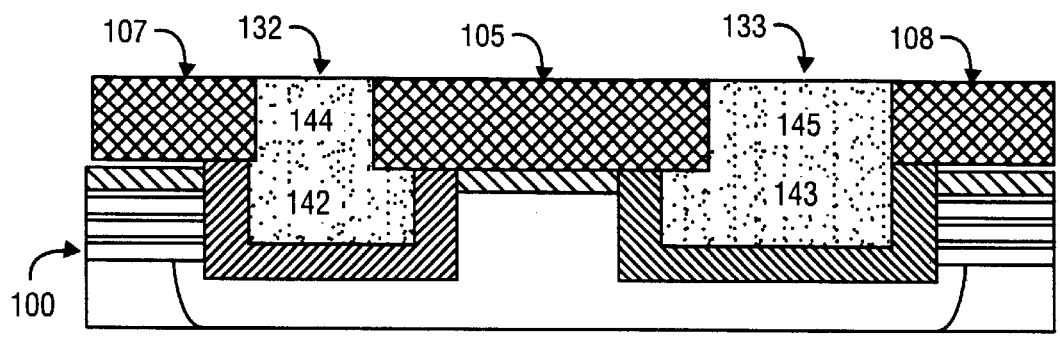

After trenches 109, 110 are etched into substrate 100, source and drain regions are created using epitaxial growth. In a preferred embodiment of the present invention, heavily doped portions of the channel are also formed in this manner. With reference to FIG. 1c, an epitaxial growth process is applied to form heavily doped portions 140, 141, which line the sides and bottoms of trenches 109, 110. Heavily doped portions 140, 141 thus fill a first part of trenches 109, 110 with heavily doped regions that have a first conductivity type. Those regions perform the function that halo implants perform in a conventional channel doping process. When forming a device having an n-type source and drain and a p-type channel, portions 140, 141 will be doped p+. When forming a device having a p-type source and drain and an n-type channel, portions 140, 141 will be doped n+.

To form p+ portions 140, 141, a silicon source (e.g., silane or dichlorosilane) and a boron source (e.g., diborane) are fed into an epitaxial growth reactor that contains the wafer to be processed. In a preferred embodiment, the reactor is operated for a time sufficient to generate an epitaxially grown layer comprising boron doped silicon that is between about 10 and about 20 nanometers thick. Preferably, epitaxially grown, boron doped, portions 140, 141 will have a boron concentration that is between about $10^{18}$ and about $10^{20}$ atoms/cm$^3$. If portions 140, 141 are to be doped n+ instead of p+, a phosphorus or arsenic source (e.g., phosphine or arsine) is fed into the epitaxial growth reactor instead of a boron source. When doping portions 140, 141 n+, epitaxially grown portions 140, 141 should comprise, at the end of the process, an n+ doped silicon layer that is between about 10 and about 20 nanometers thick, and that has a phosphorus or arsenic concentration that is between about $10^{18}$ and about $10^{20}$ atoms/cm$^3$.

After heavily doped portions 140, 141 are formed, an epitaxial growth process is applied to generate the source and drain—preferably using boron to form a p-type source and drain and using phosphorus and/or arsenic to form an n-type source and drain. When forming the source and drain, the epitaxial growth process is used to fill a second part of trenches 109, 110—preferably completely filling those trenches—with a doped silicon layer having a second conductivity type. The same process used to form portions 140, 141 may be used to form the source and drain, except that the dopant used will have a conductivity type that is opposite the conductivity type of the dopant used to form portions 140, 141. For a p-type channel, the source and drain will be n-type. For an n-type channel, the source and drain will be p-type.

In a preferred embodiment of the present invention, it may be desirable to form source and drain regions that include a lightly doped portion that extends underneath mask 105, and a heavily doped portion that is formed adjacent to the lightly doped portion. A two step process may be used to form such source and drain regions. First, an epitaxially grown layer, preferably between about 5 and about 20 nanometers thick, is formed on top of heavily doped portions 140, 141. Boron is preferably used to form such lightly doped regions for a p-type source and drain, preferably at a concentration between about $10^{17}$ and about $10^{18}$ atoms/cm$^3$. Phosphorus or arsenic is preferably used to form lightly doped regions for an n-type source and drain, also preferably at a concentration between about $10^{17}$ and about $10^{18}$ atoms/cm$^3$.

In this embodiment of the present invention, heavily doped portions are epitaxially grown on top of lightly doped portions to complete the source and drain. To form the heavily doped portions for a p-type source and drain, boron doped silicon is preferably grown. For an n-type source and drain, phosphorus or arsenic doped silicon is preferably grown. Because the epitaxial growth process enables higher doping concentrations than those that a conventional ion implantation process can produce, such heavily doped portions may have a concentration that exceeds solid solubility limits for the selected substrate and dopant. The boron concentration for p-type heavily doped portions and the phosphorus or arsenic concentration for n-type heavily doped portions are preferably between about $10^{20}$ and about $10^{21}$ atoms/cm$^3$.

Although lightly doped and heavily doped portions are preferred, the epitaxial growth process enables formation of a source and drain having more complex doping profiles. Multiple layers having gradually increasing dopant concentrations, or having different dopants (e.g., phosphorus for some layers and arsenic for others), may be stacked onto heavily doped portions 140, 141 to form the source and drain. To form such a structure, the reactor may be run, using a selected dopant and dose, until the desired thickness for a particular layer is reached. The reactor conditions may then be modified to enable a layer having a higher (or perhaps lower) dopant concentration to be grown on the underlying layer until a desired thickness is obtained, and so forth until the source and drain are completed.

In addition to using an epitaxial growth process as a substitute for ion implantation for forming the source and drain, epitaxial growth may be used to generate novel doping profiles, such as those that retrograde doping or modulation doping may create. Although silicon provides the preferred material for forming the epitaxially grown layers, a silicon-germanium composite may be used instead.

In one embodiment of the present invention, it may be desirable to use the epitaxial growth process to completely fill trenches 109, 110 and spaces 130, 131. It may be desirable to fill those spaces to enable a substantially planar surface to be formed prior to subsequent deposition steps. To ensure that spaces 130, 131 are completely filled, the epitaxial growth process should be continued until some degree of overgrowth results (i.e., some degree of grown doped silicon spills over mask 105 and mask structures 107, 108).

Following such an overgrowth step, the epitaxially grown doped silicon may be polished back, e.g., by using a conventional chemical mechanical polishing (CMP) step, until surfaces 132, 133 are substantially flush with the surface of mask 105. In the resulting structure, shown in FIG. 1d, source and drain regions 142, 143 include portions 144, 145 that extend above substrate 100. When making a CMOS device, using the method of the present invention, separate CMP steps may be applied to remove excess material from the n-channel device's source and drain regions and from the p-channel device's source and drain regions. Alternatively, a single CMP step may be applied after source and drain regions are grown for both the p-channel and n-channel devices.

Using an epitaxial growth process enables creation of source and drain regions with doping concentrations that can exceed solid solubility limits. In addition, such growth enables more control over the location of source/drain junctions, and enables the generation of highly abrupt junctions with transition regions on the order of nanometers. In a preferred embodiment, parts of source and drain regions 142, 143 that have a concentration greater than or equal to about $10^{17}$ atoms/cm$^3$ may be separated from parts of heavily doped portions 140, 141 that have a concentration greater than or equal to about $10^{18}$ atoms/cm$^3$ by less than about 10 nanometers.

Figure 1E:
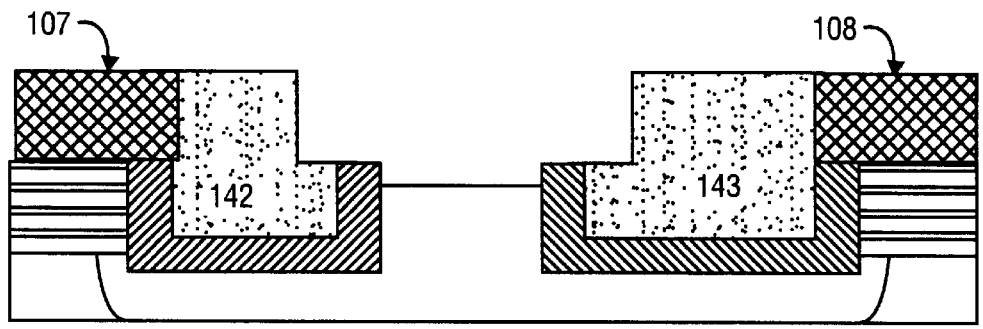
Figure 1F:
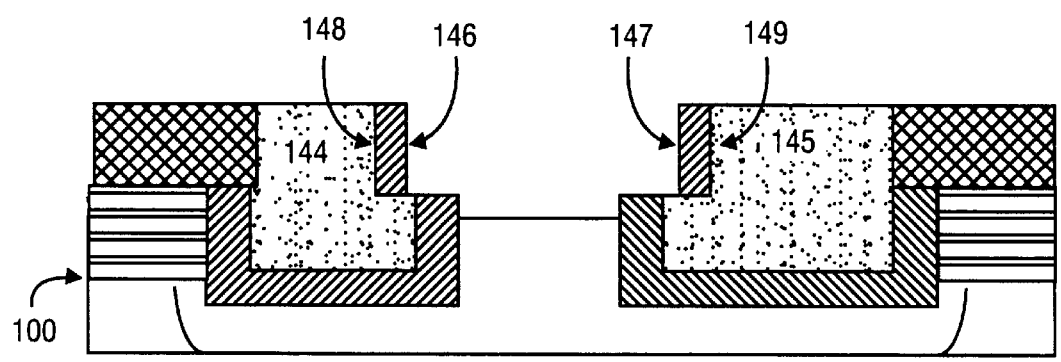

After source and drain regions 142, 143 are formed, mask 105 is removed, e.g., by using an etchant that is selective for silicon nitride over silicon. Structures 107 and 108 may be protected by resist to ensure that only mask 105 is etched during this process step. A cross-section of the resulting device is shown in FIG 1e.

Next, spacers 146, 147 are formed on sides 148, 149 of portions 144, 145 that extend above substrate 100. Those spacers may be formed in the following manner. First, a relatively thin layer of silicon dioxide is deposited onto the overall structure. A hotwall low pressure chemical vapor deposition process using tetraethylorthosilicate (TEOS) as a silicon source may be used—as may any other conventional process for depositing a thin silicon dioxide layer. Preferably, the resulting layer will be less than or equal to about 5 nanometers thick. A silicon nitride containing layer is then deposited over that silicon dioxide layer. An anisotropic etch step is then applied to remove the silicon nitride containing layer and the underlying oxide, except where they are located on sides 148, 149, producing the structure shown in FIG. 1f. In a preferred embodiment, spacers 146, 147 are between about 10 and about 20 nanometers thick.

Figure 1G:
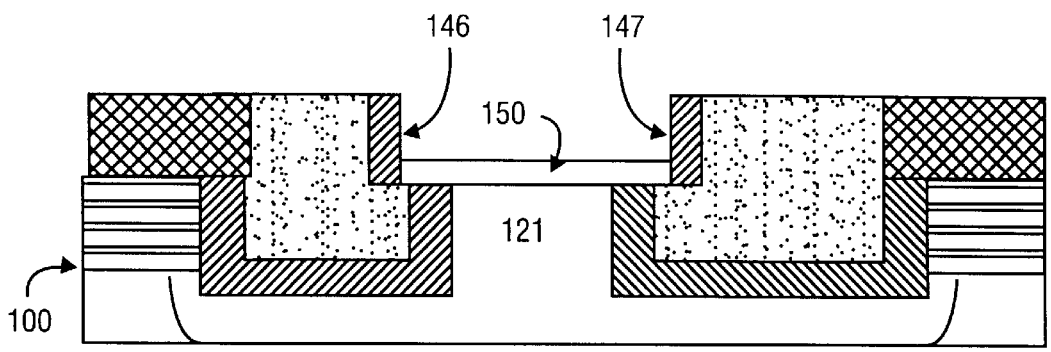
Figure 1H:
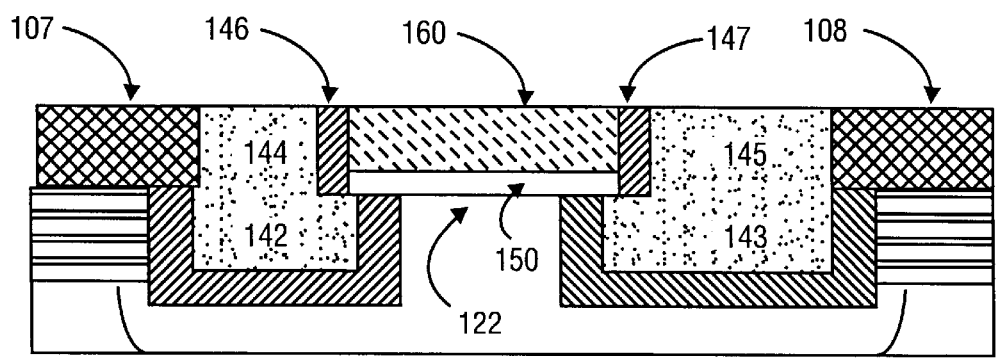

After forming spacers 146, 147, gate oxide 150 is formed on second part 121 of substrate 100. Prior to forming the gate oxide, a sacrificial oxide is grown on substrate 100 using conventional process steps. That sacrificial oxide is then removed to ensure that substrate 100's surface is substantially free of particulate and metallic contaminants. Gate oxide 150 preferably is formed by growing a very thin layer of silicon dioxide, e.g., a layer that is less than about 20 angstroms thick, on substrate 100 using conventional equipment, materials and process steps. The resulting structure is shown in FIG. 1g.

Forming the gate oxide after the source and drain regions are formed provides a significant advantage. If the epitaxial growth process had been applied to form the source and drain after the gate oxide was already formed, process steps used to create the source and drain could damage the gate oxide. Because, however, the method of the present invention forms the gate oxide after the source and drain regions are already formed, the gate oxide will not be damaged or contaminated by process steps that would have been required to epitaxially grow those regions after forming the gate oxide.

After forming gate oxide 150, an etched polysilicon layer 160 is formed on top of it to define the gate electrode. To form layer 160, a damascene process may be used. In that process, a polysilicon layer, which may be doped n+ or p+, is deposited over the entire structure, filling the space between spacers 146, 147, covering portions 144, 145 of source and drain regions 142, 143, and covering structures 107, 108. That polysilicon layer is then removed, except where it was deposited between spacers 146, 147. A CMP step may be used to remove the excess polysilicon. In the resulting structure, shown in FIG. 1*h*, the thickness of polysilicon layer 160 should be approximately equal to the thickness of portions 144, 145, and structures 107, 108, and should preferably be between about 40 and about 100 nanometers.

After the CMP step, conventional process steps may be used to complete the semiconductor device, as will be apparent to those skilled in the art. Such a semiconductor device will have source and drain regions 142, 143 that are separated by channel 122 and that are self-aligned and adjacent to a gate electrode. The term "adjacent," as used herein, refers to one structure being in close proximity to another and does not necessarily mean that structures are perfectly aligned or abut one another. For example, with reference to FIG. 1*h*, although source and drain regions 142, 143 are "adjacent" to polysilicon layer 160, they extend a relatively short distance underneath layer 160. Source and drain regions that extend a relatively small distance beneath a gate electrode or etched polysilicon layer, or are spaced a relatively small distance from such structures, are considered to be adjacent to such structures as that term in used in this specification and in the appended claims.

The method described above generates a semiconductor device that has an epitaxially grown source and drain that are self-aligned to a gate electrode. Using such an epitaxial growth process to form source and drain regions enables those regions to be highly doped and to have abrupt junctions. Features shown in the above figures are not intended to be drawn to scale, nor are they intended to be shown in precise positional relationship. Additional process steps that may be used to make a semiconductor device following the teachings of the present invention have been omitted when not useful to describe aspects of the present invention.

Although the foregoing description has specified a method for making a semiconductor device that includes certain steps, and has specified certain materials and equipment that may be used to carry out those process steps, those skilled in the art will appreciate that many modifications and substitutions may be made. Accordingly, it is intended that all such modifications, alterations, substitutions and additions be considered to fall within the spirit and scope of the invention as defined by the appended claims.

What is claimed is:

1. A method for making a semiconductor device comprising:

forming a mask on a first part of a substrate;

forming trenches adjacent to the mask to define a second part of the substrate;

applying an epitaxial growth process to fill the trenches to create a heavily doped portion of a channel and epitaxially grown source and drain regions, such that the source and drain regions have sides and are separated by the channel, and wherein the epitaxial growth process for creating the source and drain regions causes portions of those regions to extend above the first part of the substrate;

forming spacers on the sides of the source and drain regions; then forming a gate oxide on the first part of the substrate; then forming an etched polysilicon layer on the gate oxide.

2. The method of claim 1 further comprising removing the mask after forming the source and drain regions, and forming the spacers by:

depositing a silicon nitride containing layer over the channel and the source and drain regions; then applying an anisotropic etch step to remove the silicon nitride containing layer except where it is located on the sides of the source and drain regions.

3. The method of claim 2 further comprising:

filling a first part of the trenches with heavily doped regions having a first conductivity type to form a heavily doped portion of the channel, then filling a second part of the trenches with doped regions having a second conductivity type to form the source and drain regions.

4. The method of claim 3 wherein the heavily doped portion of the channel is formed by filling the first part of the trenches with silicon doped with boron at a concentration between about $10^{18}$ and about $10^{20}$ atoms/cm$^3$, and wherein at least part of the source and drain regions are formed by filling part of the trenches with silicon doped with an n-type dopant, selected from the group consisting of phosphorus and arsenic, at a concentration between about $10^{20}$ and about $10^{21}$ atoms/cm$^3$.

5. The method of claim 3 wherein the heavily doped portion of the channel is formed by filling the first part of the trenches with silicon doped with an n-type dopant, selected from the group consisting of phosphorus and arsenic, at a concentration between about $10^{18}$ and about $10^{20}$ atoms/cm$^3$, and wherein at least part of the source and drain regions are formed by filling part of the trenches with silicon doped with boron at a concentration between about $10^{20}$ and about $10^{21}$ atoms/cm$^3$.

6. The method of claim 3 wherein the etched polysilicon layer is formed by depositing a heavily doped polysilicon layer over the channel and the source and drain regions; then removing portions of that polysilicon layer to generate an etched polysilicon layer having a surface that is substantially flush with the surface of the spacers and the source and drain regions.

7. The method of claim 3 wherein the heavily doped regions having a first conductivity type are between about 10 and about 20 nanometers thick, and wherein the doped regions having a second conductivity type comprise a lightly doped region that extends beneath the etched polysilicon layer by between about 5 and about 20 nanometers and a heavily doped region that is formed adjacent to the lightly doped region.

8. The method of claim 3 wherein the spacers are between about 10 and about 20 nanometers thick.

9. A method for making a semiconductor device comprising:

forming a mask on top of a substrate;

forming trenches within the substrate that are adjacent to the mask;

filling a first part of the trenches by epitaxially growing heavily doped regions having a first conductivity type to form a heavily doped portion of a channel;

filling a second part of the trenches by epitaxially growing doped regions having a second conductivity type to form source and drain regions that have sides;

removing the mask;

forming spacers on the sides of the source and drain regions;

forming a gate oxide on the substrate between the spacers; and forming an etched polysilicon layer on the gate oxide.

10. The method of claim 9 wherein the heavily doped portion of the channel is formed by filling the first part of the trenches with silicon doped with boron at a concentration between about $10^{18}$ and about $10^{20}$ atoms/cm$^3$, and wherein at least part of the source and drain regions are formed by filling part of the trenches with silicon doped with an n-type dopant, selected from the group consisting of phosphorus and arsenic, at a concentration between about $10^{20}$ and about $10^{21}$ atoms/cm$^3$.

11. The method of claim 9 wherein the heavily doped portion of the channel is formed by filling the first part of the trenches with silicon doped with an n-type dopant, selected from the group consisting of phosphorus and arsenic, at a concentration between about $10^{18}$ and about $10^{20}$ atoms/cm$^3$, and wherein at least part of the source and drain regions are formed by filling part of the trenches with silicon doped with boron at a concentration between about $10^{20}$ and about $10^{21}$ atoms/cm$^3$.

12. The method of claim 9 wherein the mask and the spacers comprise silicon nitride, and wherein the source and drain regions comprise lightly doped portions, which extend under the etched polysilicon layer by between about 5 and about 20 nanometers, and heavily doped portions that are formed adjacent to the lightly doped portions.

13. A method for making a semiconductor device comprising:

depositing a first silicon nitride containing layer on top of a first silicon dioxide layer, which has been formed on a substrate;

etching the first silicon nitride layer to form a mask;

forming trenches within the substrate that are adjacent to the mask;

epitaxially growing heavily doped regions having a first conductivity type to fill a first part of the trenches to form a heavily doped portion of a channel;

epitaxially growing doped regions having a second conductivity type to fill a second part of the trenches to form source and drain regions that have sides and are separated by the channel;

removing the mask and the first silicon dioxide layer;

forming a second silicon dioxide layer over the channel and the source and drain regions;

depositing a second silicon nitride containing layer on top of the second silicon dioxide layer;

etching the second silicon nitride containing layer and the second silicon dioxide layer to form spacers on the sides of the source and drain regions;

forming a gate oxide on the substrate between the spacers; and forming an etched polysilicon layer on the gate oxide.

* * * * *